US008657546B2

(12) United States Patent
Kang

(10) Patent No.: US 8,657,546 B2
(45) Date of Patent: Feb. 25, 2014

(54) COVER DEVICE FOR FIXING PORTION

(75) Inventor: Tae-Hwan Kang, Gyeongsangbuk-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 78 days.

(21) Appl. No.: 13/404,664

(22) Filed: Feb. 24, 2012

(65) Prior Publication Data

US 2013/0009527 A1 Jan. 10, 2013

(30) Foreign Application Priority Data

Jul. 7, 2011 (KR) .................. 10-2011-0067173

(51) Int. Cl.
*F16B 37/14* (2006.01)
(52) U.S. Cl.
USPC ............... 411/372.5; 411/372.6; 411/373; 411/548

(58) Field of Classification Search
USPC ........... 411/372.5, 372.6, 373, 374, 429, 548
See application file for complete search history.

(56) References Cited

U.S. PATENT DOCUMENTS 7,708,510 B2 * 5/2010 Reimler .................. 411/166
2007/0269290 A1 11/2007 Chang

* cited by examiner

*Primary Examiner* — Roberta Delisle
(74) *Attorney, Agent, or Firm* — Cha & Reiter, LLC

(57) ABSTRACT

Disclosed is a cover device for a fixing portion, including a coupling hole formed at a side of the fixing portion, and a cover member rotatably coupled with the coupling hole to selectively close the fixing portion, wherein the fixing portion includes a fastening member and a fastening hole, to which the fastening member is fastened. By forming the coupling hole at a side of the fastening hole and rotatably coupling the cover member to a case member, the cover device can prevent the cover member from being lost during fastening or separating the fastening member.

19 Claims, 6 Drawing Sheets

COVER DEVICE FOR FIXING PORTION

CLAIM OF PRIORITY

This application claims the priority under 35 U.S.C. §119 (a) of an application entitled "Cover Device For Fixing Portion" filed in the Korean Intellectual Property Office on Jul. 7, 2011 and assigned Serial No. 10-2011-0067173, the contents of which are hereby incorporated by reference.

BACKGROUND OF THE INVENTION

1. Field of the Invention

The present invention relates to a fixing device, and more particularly to a cover device for covering a fastening member, such as a screw for fixedly assembling a case of a portable terminal or the like.

2. Description of the Related Art

In general, portable electronic terminals, such as mobile communication terminals, tablet PCs and portable game machines, or household electric appliances, such as TV sets and vacuum cleaners, include case members formed from a synthetic material or a metallic material so as to receive and protect various circuit devices and input/output devices. The case housing the components is completed by assembling and fastening the case members to each other, using fastening members, such as screws. In a case of a terminal box for wiring of a house or a building, or the like, an external case may be fixed to the terminal box, using fastening members, such as screws. However, holes for fastening the screws or the fastened screws are unavoidably exposed to the outside.

For portable terminals, especially for mobile communication terminals, consumers' demands are diversified in terms of design and external appearance. As a result, in order to improve the designs and appearances of portable terminals to be more pleasing and marketable, various efforts are made to reduce inter-part boundaries and to prevent fastening members or the like from being exposed to the exterior.

FIG. 1 is a perspective view of a conventional cover device for a fixing portion of a case assembly. As shown, the cover device includes a cover member 19 for covering a screw hole 13 and a screw 17 and preventing them from being exposed to the outside of a case member 11. The screw hole 13 extends through the inner and outer surfaces of the case member 11, and the screw 17 is fastened through the screw hole 13 to couple the case member 11 with another case member or to fix a circuit board or the like received in the case member 11 to the case member 11. A seating groove 15 is formed around the screw hole 13 on the outer surface of the case member 11, in which the head of the screw 17 is seated within the seating groove 13 so that the head does not protrude from the outer surface of the case member 11. Also, the cover member 19 is forcedly fitted and then fixedly seated in the seating groove 15 or is seated in the seating groove 15, then fixed therein by using an adhesive member, such as a double sided adhesive tape. As the cover member 19 has been seated in the seating groove 15, the screw 17 is concealed by the cover member 19 and the outer surface of the cover member 19 is kept generally flush with the outer surface of the case member 11.

As a result, the screw hole 13, the seating groove 15, and the fastening member 17 fastened to the screw hole 13, which may be otherwise exposed to the outside of the case member 11 without the cover member 19, are concealed by the cover member 19. In this state, although the cover member 11 may provide a visual sense of difference, the cover member 19 can improve the external appearance of the case member 11, and hence the external appearance of a terminal or the like, to which the case member 11 is applied, can be made to be more appealing.

However, the conventional cover device for a fixing portion as described above has problems in that when the cover member is separated for the purpose of replacing or repairing internal components, the possibility of losing the cover member is high, and also the cover member may be damaged or deformed in the process of separating it.

SUMMARY OF THE INVENTION

Accordingly, the present invention has been made to solve the above-mentioned problems occurring in the prior art and provides additional advantages, by providing a cover device which can alleviate the damage and deformation of a cover member and also prevent the cover member from being lost when changing and/or repairing internal components of assemblies, while improving the various external appearances of the assemblies to be more appealing.

In accordance with an aspect of the present invention, a cover device for a fixing portion includes: a coupling hole formed at a side of the fixing portion; and a cover member rotatably coupled with the coupling hole to selectively close the fixing portion.

In accordance with another aspect of the present invention, a cover device for a fixing portion having a fastening member and a fastening hole includes: a coupling hole formed at a side of the fastening hole; a cover member rotatably coupled with the coupling hole to selectively close the fastening hole and the fastening member coupled with the fastening hole; and a coupling boss formed on the inner surface of the cover member, the coupling boss being rotatably engaged in the coupling hole to make the cover member rotatable.

In accordance with another aspect of the present invention, a terminal housing comprised of a pair of casings includes an elastic cover member for covering a fixing portion that hold the pair of casings together, and a coupling opening provided at one side of the fixing portion to rotatably coupled to the coupling opening;

By forming the coupling hole adjacent to the fastening hole and rotatably coupling the cover member to a case member, the cover device configured as described above can prevent the cover member from being lost during fastening or separating the fastening member. In addition, by fixing the cover member to the case member, or fabricating the cover member using an elastic material, it is possible to alleviate the damage or deformation of the cover member when separating the cover member from the case member.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION

Hereinafter, embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
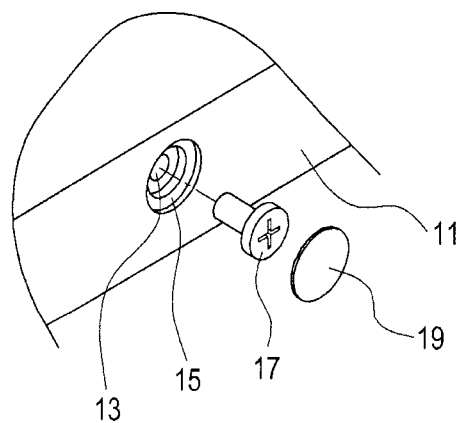
FIG. 1 is a perspective view showing a conventional cover device showing a fixing portion area.
Figure 2:
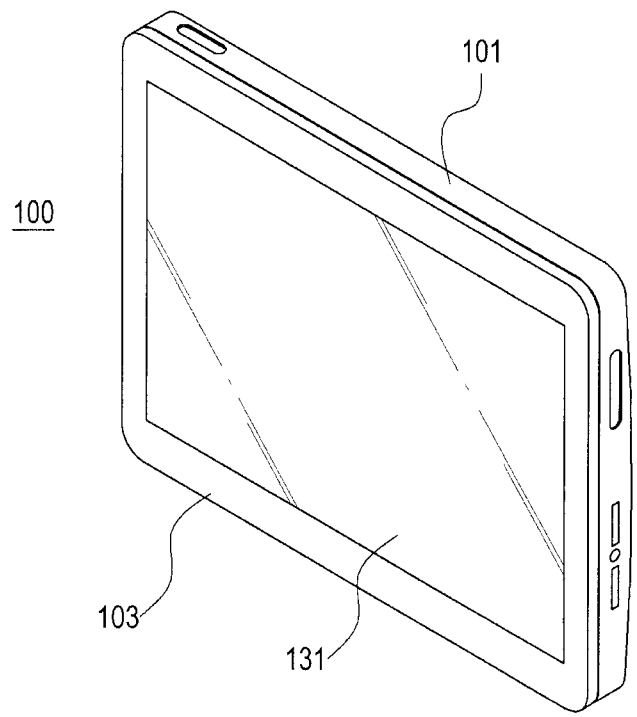
FIG. 2 is a perspective view showing a portable terminal employing a case assembly having a cover device for covering a fixing portion area in accordance with an embodiment of the present invention.
Figure 3:
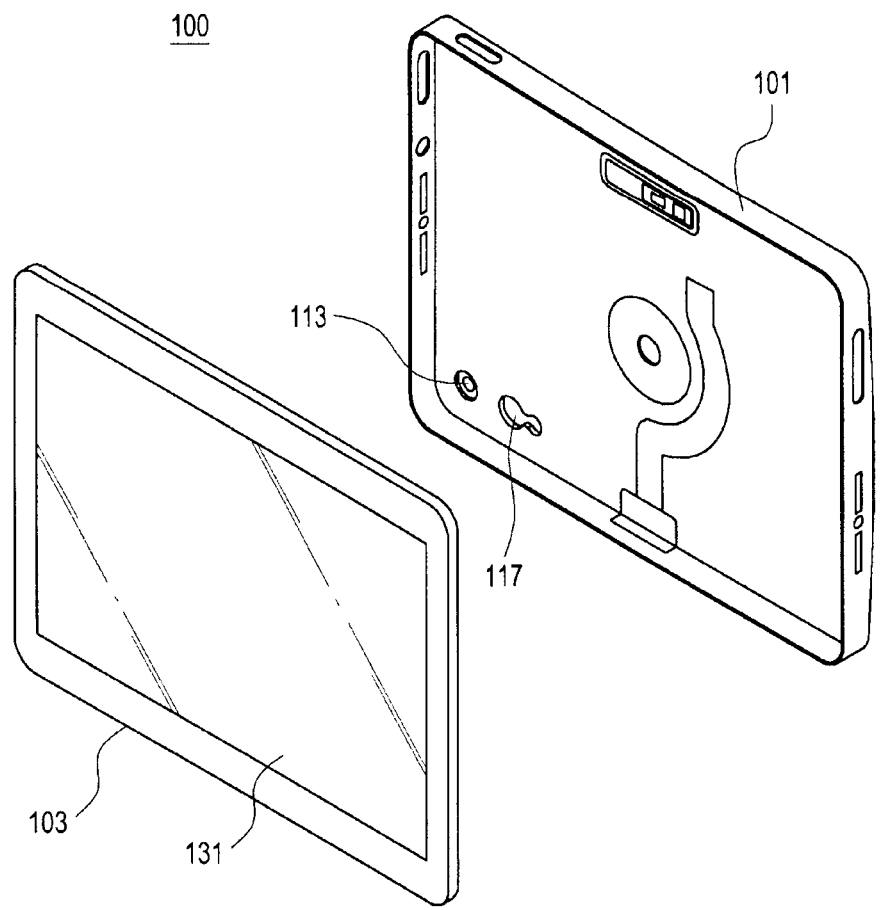
FIG. 3 is an exploded perspective view of the case assembly of the portable terminal shown in FIG. 2.
Figure 4:
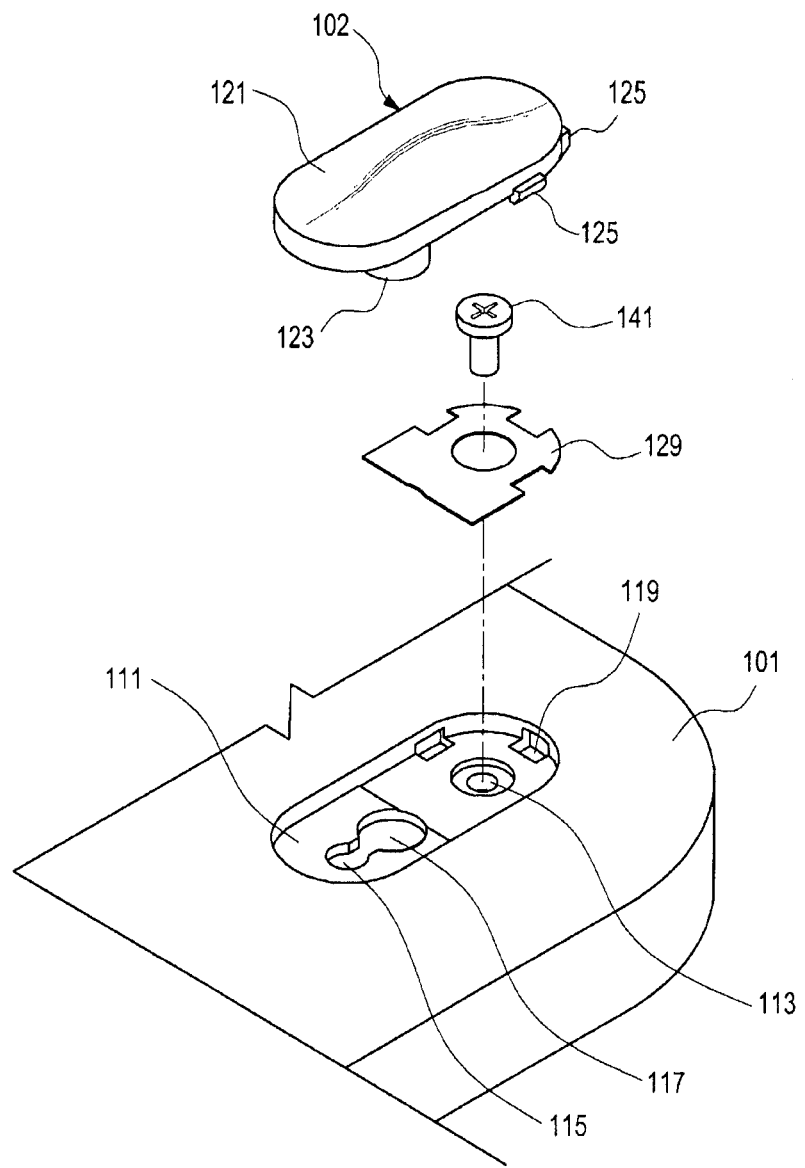
FIG. 4 is an exploded perspective view showing the cover device for covering a fixing portion of the case assembly shown in FIG. 3.
Figure 5:
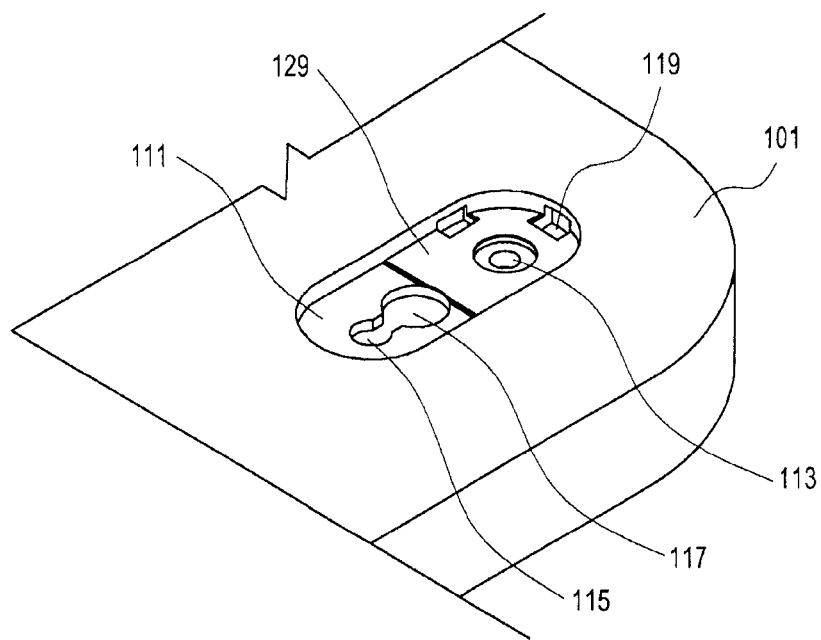
FIG. 5 is a perspective view showing a part of the cover device shown in FIG. 4.

FIGS. 2 and 3 show an example of a portable terminal 100 with a case assembly which is provided with a cover device for covering a fixing portion area in accordance with an embodiment of the present invention.

The portable terminal 100 shown in FIGS. 2 and 3 corresponds to a tablet PC as an illustrative example. The terminal 100 includes a display device 131, which is provided on the front side of the terminal 100 and has a touch screen function. A speaker opening, various keys for use in controlling power and volume, and a connector for connecting an external appliance, such as a charger or a computer, may be provided on the lateral sides of the terminal 100. The case assembly of the terminal 100 is completed by assembling a pair of case members 101 and 103 to each other, and then fixing the case members 101 and 103 to each other through fastening members, such as screws.

Although the present embodiment discusses a cover device for covering a fixing portion applied to a portable terminal as an example, the inventive cover device can be applied to other consumer electric appliances, such as a television set or a vacuum cleaner, or a terminal box for wiring of a house or a building.

Now, the construction of a cover device for concealing a fixing portion to be used for coupling the case members 101 and 103 to each other will be described with reference to FIGS. 4 to 8.

The cover device includes a coupling hole 115 formed adjacent to a fastening hole 113, and a cover member 102 coupled with the coupling hole 115. The cover member 102 is rotatably joined to the coupling hole 115 to selectively conceals the fastening member 141 fastened to the fastening hole 113.

The fastening hole 113 is formed through the outer and inner surfaces of one ("first case member") of the case members 101 and 103, and the fastening member 141 is coupled through the fastening hole 113. A stepped groove may be formed around the fastening hole 113 on the outer surface of the first case member 101 so as to receive the head of the fastening member 141. The fastening member 141 is inserted through the fastening hole 113 and is then coupled with a circuit board (not shown) disposed inside of the first case member 101, and with the inner surface of the second case member 103 among the case members 101 and 103. Depending on the position of the fastening hole 113, the fastening member 141 may be coupled with a speaker module, a switch module, or a microphone module, instead of the circuit board. That is, depending on the position of the fastening hole 113, the fastening member 141 may fix circuit devices disposed within the first and second case members 101 and 103 to the inside of the first and second case members 101 and 103.

The fastening hole 113 may be formed in any of various assemblies, such as a case of a portable terminal or a case of a terminal box, to provide a space for coupling a fastening member, such as a screw, so that the fastening hole 113 may be used for assembling, coupling and/or fixing the assembly.

Figure 6:
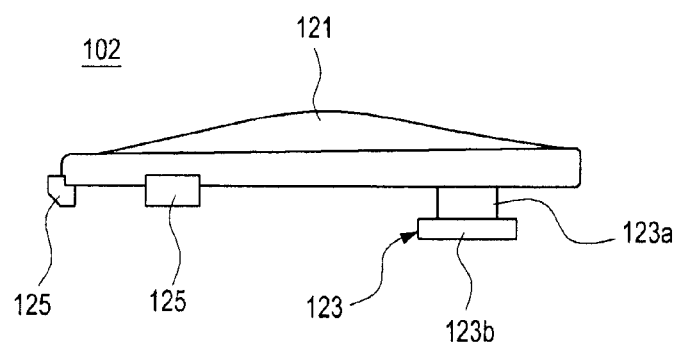
FIG. 6 is a side view of the cover member shown in FIG. 4.

The coupling hole 115 is formed through the inner and outer surfaces of the first case member 101 at one side of the fastening hole 113. The cover member 102 is rotatably coupled with the coupling hole 115 by means of a coupling boss 123 formed on the inner surface of the cover member 102. The coupling boss 123 includes a rotary part 123a, which vertically protrudes from the inner surface of the body 121 of the cover member 102, and a support part 123b, which is provided at the end of the rotary part 123a. As shown in FIG. 6, the support part 123b has a diameter larger than that of the rotary part 123a, and thus the entire cross-sectional shape of the coupling boss 123 is similar to the letter "T".

The cover member 102 may be formed from an elastic material, e.g. a silicone or urethane material, and the coupling boss 123 is also formed from an elastic material. If the coupling boss 123 is forcedly inserted to the coupling hole 115 from the outer surface of the first case member 101, the support part 123b is temporarily compressed and then introduced into the inside of the first case member 101. As a result, the rotary part 123a is positioned within the coupling hole 115, and the support part 123b is abutted against the inner surface of the first case member 101. However, as described in more detail later, the cover device may further include a boss assembling hole 117 so as to facilitate the assembling of the cover member 102 with the first case member 101.

As the rotary part 123b has been rotatably disposed within the coupling hole 115, the cover member 102 is also rotatable about the rotary part 123a on the first case member 101. The body 121 of the cover member 102 extends perpendicularly to the rotary part 123a, and the rotary part 123a is positioned adjacent to one lateral end of the body 121. Therefore, if the cover member 102 is rotated about the rotary part 123a, a part of the outer surface of the first case member 101 is opened or closed by the cover member 102. Therefore, in a state in which the fastening member 141 is coupled with the fastening hole 113, the fastening hole 113, more particularly the fastening member 141, can be selectively concealed by the cover member 102.

As described above, the cover device may further include a boss assembling hole 117 in order to facilitate the assembling of the cover member 102, more particularly the coupling boss 123, with the first case member 101. Also, the coupling boss 123 has a supporting part 123b formed at the end of the rotary part 123a, and the supporting part 123b is abutted against the inner surface of the first case member 101. Here, the supporting part 123b inevitably has a diameter larger than that of the coupling hole 115. Therefore, the boss assembling hole 117 is provided so as to enable the support part 123b to be easily engaged or assembled with the inner side of the first case member 101.

Figure 7:
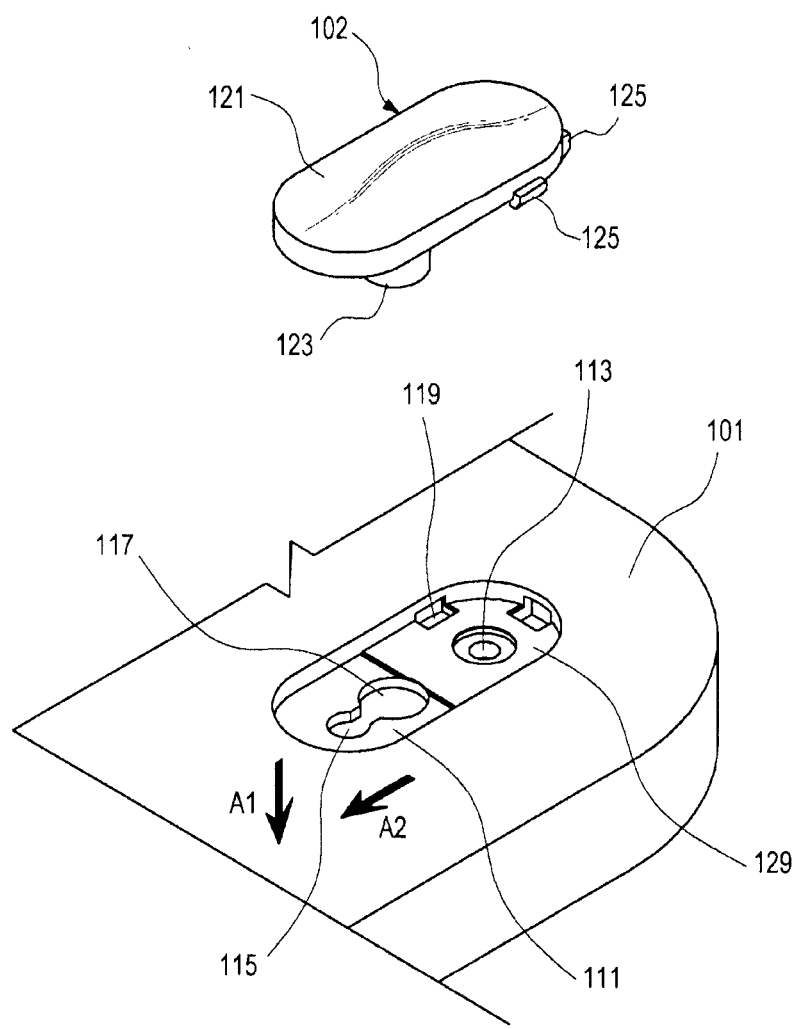
FIG. 7 is an exploded perspective view for describing a process of assembling the cover member shown in FIG. 4 to a fastening hole.

The boss assembling hole 117 is formed between the fastening hole 113 and the coupling hole 115 and extends from the coupling hole 115. The boss assembling hole 117 preferably has a larger diameter, more particularly a diameter larger than that of the supporting part 123b. By providing the boss assembling hole 117, the supporting part 123b can be introduced into the inside of the first case member 101 through the boss assembling hole 117 in the direction indicated by arrow A1, as shown in FIG. 7. If the cover member 102 is moved in the direction indicated by arrow A2 in a state in which the supporting part 123b has been positioned on the inner surface of the first case member 101, the rotary part 123a is introduced into the coupling hole 115, and the supporting part 123b is abutted against the inner surface of the first case member 101 around the coupling hole 115.

In order to prevent the cover member 102 from protruding from the outer surface of the first case member in a state in which the fastening hole 113 and the fastening member 141 are concealed by the cover member 102, the cover device may include a seating groove 111. The seating groove 111 is formed on the outer surface of the first case member 101, so that the fastening hole 113 and the coupling hole 115 are preferably positioned within the seating groove 111. When the cover member 102 has been received within the seating groove 111, not only the fastening hole 113 but the seating groove 111 is also concealed, and the outer surface of the cover member 102 is flush with the outer surface of the first case member 101.

Meanwhile, if the first case member 101 is applied to a rear case of a notebook computer or a tablet PC, a part of the cover member 102 may be formed to protrude from the outer surface of the first case member 101. In such a case, since the cover member 102 is formed from an elastic material, it may provide an anti-slip function when the notebook computer or the tablet PC is laid on a smooth surface.

If the cover member 102 has a size somewhat substantially larger than the seating groove 111, the cover member 102 may be stably fixed within the seating groove 111 when the cover member 102 has been seated within the seating groove 111. In other words, since the cover member 102 is fabricated from an elastic material and thus may be compressively deformed, the cover member 102 can be tightly received within the seating groove 111 even when the cover member 102 is larger than the seating groove 111. As such, the circumferential area of the cover member 102 can be in a close tight contact with and fixed to the inner wall of the seating groove 111 in a state in which the cover member 102 has been received in the seating groove 111.

In accordance with the present embodiment, the cover device may further include an adhesive member 129, one or more holding grooves 119, and one or more holding lugs 125 so as to fix the cover member 102 more stably in the seating groove 111. As shown, the adhesive member 129 is located on a part of the entire area of the seating groove 111 around the fastening hole 113. Here, the adhesive member 129 may be formed of a double sided adhesive tape. When the fastening hole 113 or the fastening member 141 is exposed by removing the cover member 102, the cover member 102 is rotated about the rotary part 123a. The adhesive member 129 attaches the inner surface of the cover member 102 to the seating groove 111 around the fastening hole 113, so as to fix the cover member 102 within the seating groove 111. Therefore, in order to minimize the attachment of the cover member 102 to the adhesive member 129 while the cover member 102 is being rotated, it is desirable that the adhesive member 129 is not disposed around the coupling hole 115.

Preferably, the holding grooves 119 are formed around the fastening hole 113, and the holding lugs 125 are formed around the edge of the cover member body 121. When the cover member 102 has been seated in the seating groove 111, the holding lugs 125 are engaged with the holding grooves 119, respectively, so that the cover member 102 is tightly fixed in the seating groove 111. As a result, the cover member 102 is tightly retained in the seating groove 111 by the coupling boss 123 at one side of the cover member 102 and by the holding lugs 125 at the other side thereof.

It is noted that although the adhesive member 129, the holding grooves 119, and the holding lug 125 are elements for fixing the cover member 102 to the seating groove 111, they are not indispensable to the construction of the inventive cover device since the cover member 102 itself can be fitted into the seating groove 111 through the forced inserting or forced fitting as described above.

Figure 8:
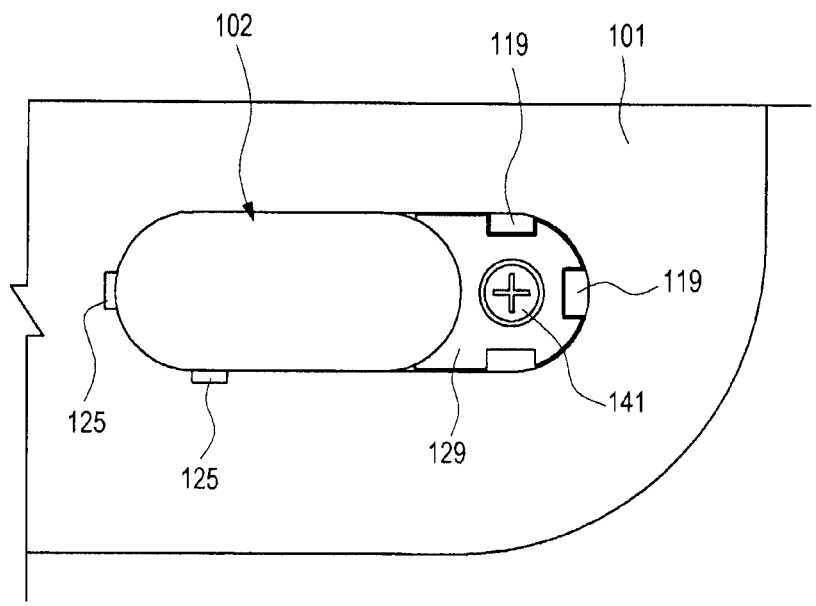
FIG. 8 is a top plan view showing the cover member of FIG. 7 assembled to the fastening hole.

FIG. 8 is a top plan view showing a state in which the cover member 102 is released from the closed state and rotated away from the fastening member 141, thus exposing the fastening member 141 fastened in the fastening hole 113. In FIG. 8, although the cover member 102 has escaped out of the seating groove 111, the cover member 102 is not separated from the first case member 101 since the supporting part 123b is rotably coupled to the rotating hole 115 and still abutted against the inner surface of the first case member 101.

In the state in which the fastening member 141 has been exposed in this manner, the fastening member 141 can be separated or reassembled. After the fastening member 141 is fully fastened, the body 121 of the cover member 102 can be rotated to be positioned on and fixedly seated in the seating groove 111 for closing.

While the invention has been shown and described with reference to certain embodiments thereof, it will be understood by those skilled in the art that various changes in form and details may be made therein without departing from the spirit and scope of the invention as defined by the appended claims.

What is claimed is:

1. A cover device for covering a fixing portion that holds a pair of casings together, comprising:
   a coupling hole provided at one side of the fixing portion;
   a cover member rotatably coupled to the coupling hole to selectively cover the fixing portion; and
   a boss assembling hole connected to the coupling hole, wherein the boss assembling hole has a diameter substantially larger than a diameter of the coupling hole.

2. The cover device as claimed in claim 1, wherein the fixing portion comprises a fastening member and a fastening hole to which the fastening member is fastened, and the coupling hole is formed adjacent to the fastening hole.

3. The cover device as claimed in claim 2, wherein the fastening member comprises a screw.

4. The cover device as claimed in claim 2, further comprising a seating groove formed on an outer surface of one of the casings, wherein the fastening hole and the coupling hole are formed within the seating groove.

5. The cover device as claimed in claim 4, wherein the cover member is tightly fixed in the seating groove when the cover member is in a closed state.

6. The cover device as claimed in claim 4, further comprising:
   at least one holding groove formed around the fastening hole at an edge of the seating groove; and
   at least one holding lug protruding from an edge of the cover member,
      wherein the holding lug is engaged with the holding groove to hold the cover member in the seating groove.

7. A cover device for covering a fixing portion that holds a pair of casings together comprising:
   a coupling hole provided at one side of the fixing portion; and
   a cover member rotatably coupled to the coupling hole to selectively cover the fixing portion;
   a seating groove formed on an outer surface of one of the casings, wherein the coupling hole is formed within the seating groove; and
an adhesive member disposed on at least a part of the seating groove, wherein the adhesive member attaches an inner surface of the cover member to the seating groove to fix the cover member in the seating groove.

8. The cover device as claimed in claim 4, wherein the circumferential area of the cover member is in a close tight contact with an inner wall of the seating groove when the cover member is in a closed state.

9. The cover device as claimed in claim 1, wherein the cover member is formed from an elastic material.

10. The cover device as claimed in claim 1, further comprising a coupling boss formed on an inner surface of the cover member, wherein the coupling boss is engaged with the coupling hole so as to rotatably couple the cover member at the one side of the fixing portion.

11. The cover device as claimed in claim 10, wherein the coupling boss is engaged with the coupling hole after horizontally moving from a state in which the coupling boss has been inserted in the boss assembling hole.

12. The cover device as claimed in claim 2, wherein the boss assembling hole extends from the coupling hole and is positioned between the fastening hole and the coupling hole.

13. A cover device for covering a fixing portion of a casing, the fixing portion having a fastening member and a fastening hole to which the fastening member is fastened, comprising:
   a coupling hole formed next to the fastening hole;
   a cover member rotatably coupled to the coupling hole to selectively cover the fastening hole and the fastening member; and
   a coupling boss formed on an inner surface of the cover member, the coupling boss being rotatably engaged with the coupling hole to enable the cover member to be rotatable; and
   a boss assembling hole connected to the coupling hole, wherein the boss assembling hole has a diameter substantially larger than a diameter of the coupling hole.

14. A terminal housing, comprising:
   a pair of casings;
   an elastic cover member for covering a fixing portion that holds the pair of casings together;
   a coupling opening provided at one side of the fixing portion, wherein the elastic cover member is rotatably coupled to the coupling opening; and
   a boss assembling hole connected to the coupling opening for receiving a coupling boss, wherein the boss assembling hole has a diameter substantially larger than a diameter of the coupling opening.

15. The terminal as claimed in claim 14, wherein the fixing portion comprises a fastening hole at one of the casings so that a fastening member is fastened to the fastening hole to join the pair of casings together.

16. The terminal as claimed in claim 15, wherein the fastening member comprises a screw.

17. The terminal as claimed in claim 15, further comprising a seating groove formed on an outer surface of one of the casings, wherein the fastening hole and the coupling opening are formed within the seating groove.

18. The terminal as claimed in claim 14, wherein the coupling boss is formed on an inner surface of the elastic cover member to rotatably engage with the coupling opening.

19. The terminal as claimed in claim 15, wherein the boss assembling hole extends from the coupling opening and is positioned between the fastening hole and the coupling opening.

* * * * *